United States Patent
Song et al.

(10) Patent No.: US 7,724,587 B2
(45) Date of Patent: May 25, 2010

(54) APPARATUSES, COMPUTER PROGRAM PRODUCTS AND METHODS FOR READING DATA FROM MEMORY CELLS

(75) Inventors: Seung-Hwan Song, Incheon (KR); Dong Hyuk Chae, Seoul (KR); Jun Jin Kong, Yongin-si (KR); Seung Hoon Lee, Seoul (KR); Dongku Kang, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 197 days.

(21) Appl. No.: 12/073,842

(22) Filed: Mar. 11, 2008

(65) Prior Publication Data

US 2009/0027971 A1  Jan. 29, 2009

(30) Foreign Application Priority Data

Jul. 23, 2007  (KR) .................. 10-2007-0073509

(51) Int. Cl.
*G11C 7/16* (2006.01)

(52) U.S. Cl. ........................ 365/189.15; 365/189.14; 365/159; 365/184; 365/189.08

(58) Field of Classification Search ............ 365/185.21, 365/189.15, 189.07, 189.08, 207, 208, 210.1, 365/189.14, 159, 184
See application file for complete search history.

(56) References Cited

U.S. PATENT DOCUMENTS

| 6,097,637 A * | 8/2000 | Bauer et al. ............ 365/185.24 |
| 6,775,186 B1 * | 8/2004 | Eshel ..................... 365/185.21 |
| 2007/1008623 * | 4/2007 | Litsyn et al. ........... 365/185.03 |

* cited by examiner

*Primary Examiner*—Hoai V Ho
*Assistant Examiner*—Jay Radke
(74) *Attorney, Agent, or Firm*—Harness, Dickey & Pierce, P.L.C.

(57) ABSTRACT

In reading data from a memory cell, a determining circuit determines whether a received voltage value is within at least one first voltage range through a one-time read operation using a semiconductor device that senses an output current corresponding to the received voltage value. The at least one first voltage range includes a first upper limit voltage value and a first lower limit voltage value. A data value of the memory cell is set as a first data value when the received voltage value is within the specific voltage range.

14 Claims, 10 Drawing Sheets

APPARATUSES, COMPUTER PROGRAM PRODUCTS AND METHODS FOR READING DATA FROM MEMORY CELLS

PRIORITY STATEMENT

This application claims priority under 35 U.S.C. §119 to Korean Patent Application No. 2007-0073509, filed on Jul. 23, 2007, in the Korean Intellectual Property Office, the entire contents of which are incorporated herein by reference.

BACKGROUND

Description of Related Art

A conventional flash memory is a non-volatile memory that retains stored data without power, while consuming less power. A flash memory allows data to be electrically input/output, but is different from other conventional memories such as dynamic random access memory (DRAM).

Conventional flash memories include NAND and NOR flash memories. A NAND flash memory may have a larger storage volume than a NOR flash memory, but a NOR flash memory may have faster reading speed.

When programming data in a conventional flash memory cell, threshold voltage sizes may be adjusted according to the data being programmed. Threshold voltage size may be used to express data programmed in the flash memory cell.

To read programmed data from the flash memory cell, the threshold voltage of the flash memory cell may be compared with at least one reference voltage, for example, a read voltage level. If the flash memory cell is operated using a Single Level Cell (SLC) method and a reference voltage is A, when a threshold voltage of a read flash memory cell is less than the reference voltage A, data programmed in the flash memory cell is read as '1'. When the threshold voltage of the read flash memory cell is greater than or equal to the reference voltage A, data programmed in the flash memory cell is read as '0'. Using a SLC method, at least two read operations may be necessary to read data by a fractional read operation method, an interval read operation method, or the like.

In another example, conventional memory cells may be operated in accordance with a Multi Level Cell (MLC) method. According to this method, the number of storable states in the cell may be three or more, and at least two read operations are necessary to read data from the memory cell.

Using a MLC method, an amount of data stored in the cell may be increased and/or stored data may be read more reliably. However, data processing speed of the memory cell may decrease because the number of read operations increases.

SUMMARY

Example embodiments relate to apparatuses and methods for reading data of a memory cell, for example, to apparatuses and methods for reading data of a flash memory cell.

At least one example embodiment provides a method for reading data from a memory cell. According to at least this example embodiment, the method may include determining whether the received voltage value is within at least one first voltage range through a one-time read operation using a semiconductor device that senses an output current corresponding to the received voltage value; and setting a data value of the memory cell as a first data value when the received voltage value is within the at least one first voltage range. The first data value may be mapped corresponding to the at least one first voltage range. The at least one first voltage range may include a first upper limit voltage value and a first lower limit voltage value.

In at least some example embodiments, the determining may further include: sensing an output current value corresponding to the voltage value received by the semiconductor device; converting the sensed output current value into a voltage dimension value; and determining whether the converted voltage value is within the at least one first voltage range. The memory cell may be or include a flash memory cell.

According to at least some example embodiments, the semiconductor device that senses a current may include a semiconductor device having negative differential transconductance. The semiconductor device having the negative differential transconductance may include at least one of a Complementary Metal Oxide Semiconductor (CMOS), a Field-induced Interband Tunneling Effect Transistor (FITET), a Single Electron Transistor, a Periodic Multiple Band Filter (PMBF) or the like.

According to at least some example embodiments, when the memory cell is operated using a Single Level Cell (SLC) method, a number of the specific voltage ranges may be one. When the memory cell is operated using a Multi Level Cell (MLC) method, a number of the specific voltage ranges may be at least one (e.g., one or more).

At least one other example embodiment provides a computer-readable recording medium storing a computer executable instructions that, when executed, cause a computer or a component thereof to perform a method of reading data from a memory cell. The method may include determining whether the received voltage value is within at least one first voltage range through a one-time read operation using a semiconductor device that senses an output current corresponding to the received voltage value; and setting a data value of the memory cell as a first data value when the received voltage value is within the at least one first voltage range. The first data value may be mapped corresponding to the at least one first voltage range. The at least one first voltage range may include a first upper limit voltage value and a first lower limit voltage value At least one other example embodiment provides an apparatus of reading data from a memory cell including a receiving circuit, a determining circuit and a setting circuit. The receiving circuit may receive a voltage value from a memory cell. The determining circuit may determine whether the received voltage value is within at least one first voltage range through a one-time read operation using a semiconductor device that senses a current corresponding to the received voltage value. The at least one first voltage range including a first upper limit voltage value and a first lower limit voltage value. The setting circuit may set a data value of the memory cell as a first data value when the received voltage value is within the at least one first voltage range. The data value may be mapped corresponding to the at least one first voltage range.

According to at least some example embodiments, the determining circuit may further include a sensing circuit, a converting circuit and a voltage range determining circuit. The sensing circuit may be configured to sense an output current value corresponding to a voltage value received by the semiconductor device. The converting circuit may be configured to convert the sensed output current value into a voltage dimension value. The voltage range determining circuit may be configured to determine whether the converted voltage value is within the at least one first voltage range.

BRIEF DESCRIPTION OF THE DRAWINGS

Example embodiments will become more apparent by describing in detail the example embodiments shown in the attached drawings. The accompanying drawings are intended to depict example embodiments and should not be interpreted to limit the intended scope of the claims. The accompanying drawings are not to be considered as drawn to scale unless explicitly noted.

DETAILED DESCRIPTION OF EXAMPLE EMBODIMENTS

Detailed example embodiments are disclosed herein. However, specific structural and functional details disclosed herein are merely representative for purposes of describing example embodiments. Example embodiments may, however, be embodied in many alternate forms and should not be construed as limited to only the embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but to the contrary, example embodiments are to cover all modifications, equivalents, and alternatives falling within the scope of example embodiments. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Reference will now be made in detail to example embodiments illustrated in the accompanying drawings, wherein like reference numerals refer to the like elements throughout. The example embodiments are described below in order to explain the present invention by referring to the figures. In some instances, well-known features are omitted to prevent cumbersome descriptions of the present invention.

Figure 1:
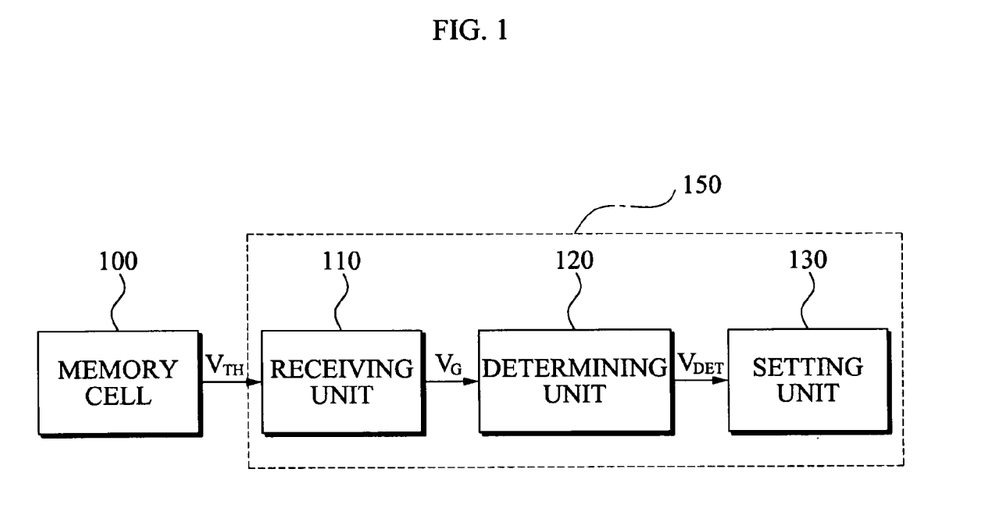
FIG. 1 is a block diagram illustrating an apparatus according to an example embodiment.

FIG. 1 is a block diagram illustrating an apparatus 150 for reading data of a memory cell and a memory cell 100 according to an example embodiment. Hereinafter, a process in which the apparatus 150 reads data of the memory cell 100 according to an example embodiment will be described in detail with reference to FIG. 1.

As illustrated in FIG. 1, the apparatus 150 may include a receiving circuit or unit 110, a determining circuit or unit 120 and a setting circuit or unit 130. The memory cell 100 may be a flash memory cell, for example, a flash memory operating in accordance with a Single Level Cell (SLC) method or a Multi Level Cell (MLC) method. Also, as shown in FIG. 1, $V_{TH}$ denotes output signals of the memory cell 100 which are read through bit lines (BLs), $V_G$ denotes an output voltage of the receiving unit 110, and $V_{DET}$ denotes an input signal of the setting unit 130 by which it sets binary values of the memory cell 100. For example, the setting unit 130 sets A when $V_{DET}$=false, and B when $V_{DET}$=true.

For reference, in FIG. 1 modules directly and indirectly related to example embodiments are illustrated. A module may designate a circuit for processing specific functions and/or operations. The module may be realized in hardware, software, or a combination thereof.

The receiving circuit 110 may receive a voltage value from an arbitrary memory cell 100. The determining circuit 120 may determine whether the received voltage value is within a specific voltage range using a semiconductor device. The semiconductor device may sense a current within the specific voltage range. In at least this example embodiment, the specific voltage range may include a specific upper limit voltage value and a specific lower limit voltage value. The setting circuit 130 may set a data value of the arbitrary memory cell 100 to a specific data value based on the determining results of the determining circuit 120 when the received voltage value is within the specific voltage range. The specific data value may be mapped according to the specific voltage range.

Figure 2:
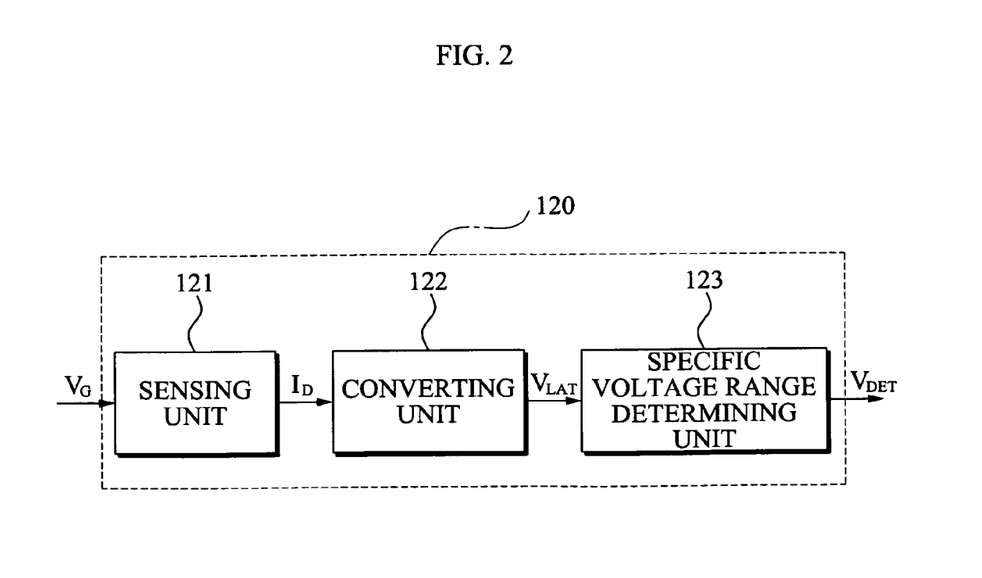
FIG. 2 is a block diagram illustrating a determining circuit according to an example embodiment.

FIG. 2 is a block diagram illustrating an example embodiment of the determining circuit 120 in more detail. Hereinafter, the determining circuit 120 of FIG. 1 will be described in detail with reference to FIG. 2.

Figure 3:
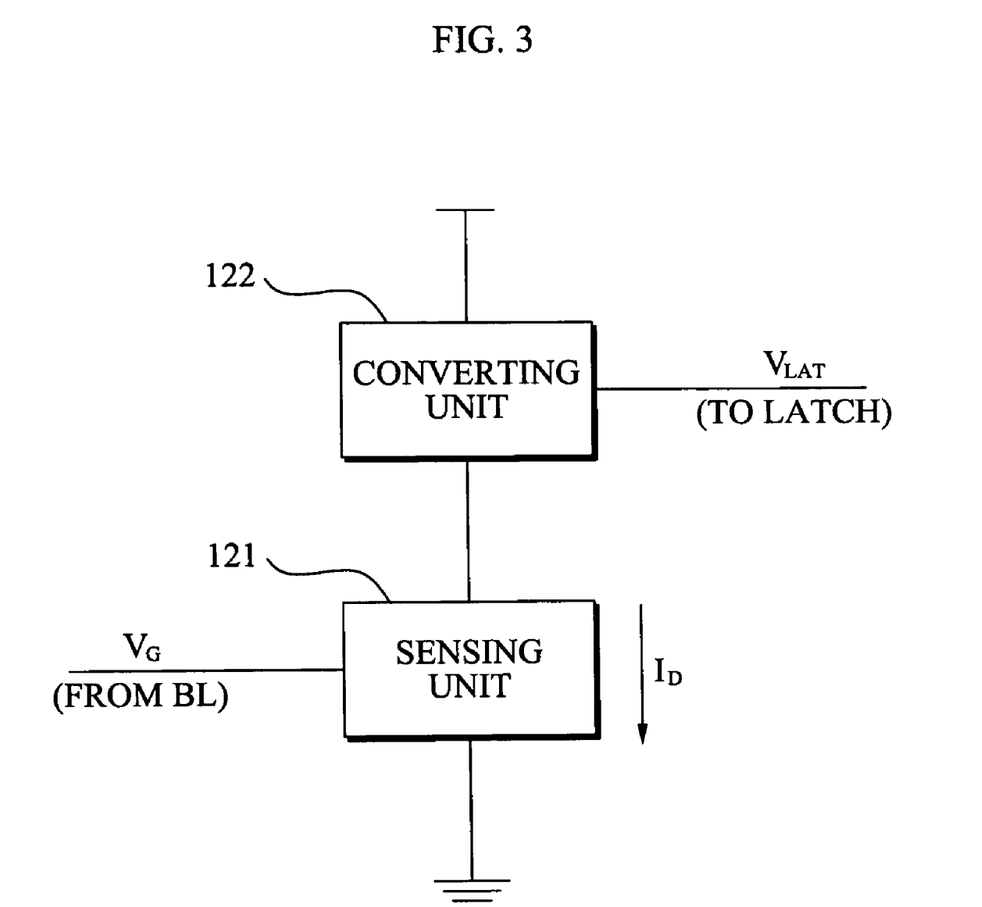
FIG. 3 illustrates an example circuit design of a sensing circuit and a converting circuit according to an example embodiment.
Figure 4A:
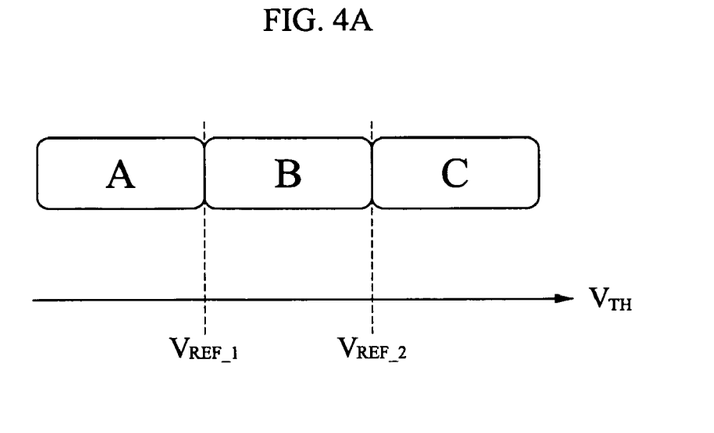
FIGS. 4A through 4C illustrate an input/output voltage relationship of FIG. 3 achievable using a single band read method.
Figure 4B:
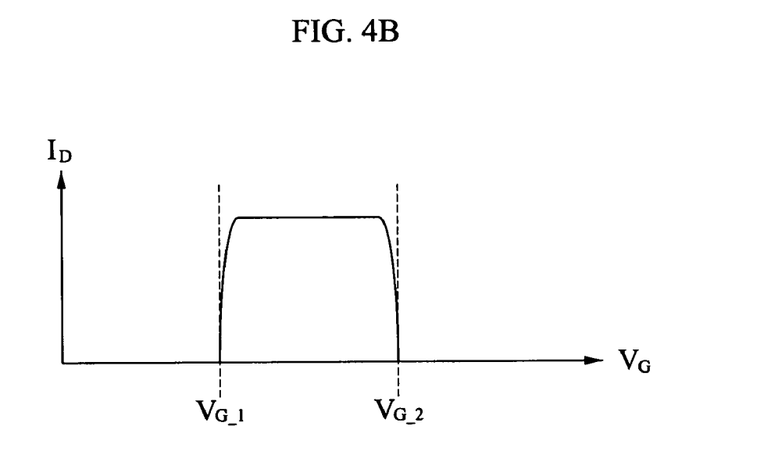
Figure 4C:
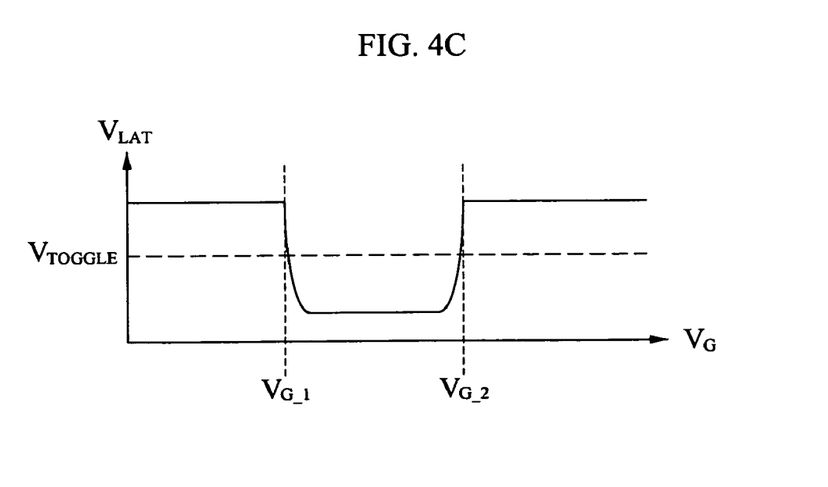

Referring to FIG. 2, the determining circuit 120 may include a sensing circuit or unit 121, a converting circuit or unit 122, and a specific voltage range determining circuit or unit 123. The sensing circuit 121 may sense an output current value corresponding to a voltage value received by the above-described semiconductor device. The converting circuit 122 may convert the sensed output current value from the sensing circuit 121 into a voltage dimension value. The specific voltage range determining circuit 123 may determine whether the converted voltage dimension value by the converting circuit 122 is within the specific voltage range. Also, as shown in FIG. 2, $V_G$ denotes an input voltage of the sensing unit 121, $I_D$ denotes an output current of the sensing unit 121, $V_{LAT}$ denotes an output voltage of the converting unit 122, and $V_{DET}$ denotes an output signal of the specific voltage range determining unit 123. For example, $V_{DET}$=false when $V_{LAT}$>$V_{TOGGLE}$, and $V_{DET}$=true when $V_{LAT}$<$V_{TOGGLE}$. FIG. 3 illustrates an example embodiment of a circuit design of the sensing circuit 121 and the converting circuit 122 in FIG. 2. FIGS. 4A through 4C illustrate an input/output voltage relationship of the circuit design of FIG. 3 achievable using a single band read method. Hereinafter, a process in which a data value of the memory cell 100 is read with a one-time read operation using the sensing circuit 121 and the converting circuit 122 of FIG. 3 will be described with reference to FIGS. 4A through 4C.

An example embodiment using a single band read method will be described with reference to FIG. 4A. In this example embodiment, the sensing circuit 121 and the converting circuit 122 designed as shown in FIG. 3 results in a mutual relationship between a voltage $V_G$ applied to the sensing circuit 121 from bitline BL and an output current $I_D$ as illustrated in FIG. 4B is achieved. When a current-to-voltage conversion device is used as the converting circuit 122, a mutual relationship between a voltage $V_G$ applied to the sensing circuit 121 and an output voltage $V_{LAT}$ as illustrated in FIG. 4C is achieved.

According to at least one other example embodiment, a semiconductor device that senses a current within a single specific voltage range may be used as the sensing circuit 121 of FIGS. 2 and 3 to obtain the results shown in FIGS. 4A through 4C. In this example, the specific voltage range may include a specific upper limit voltage value and a specific lower limit voltage value. A semiconductor device having negative differential transconductance may be used as the sensing circuit 121.

Figure 5:
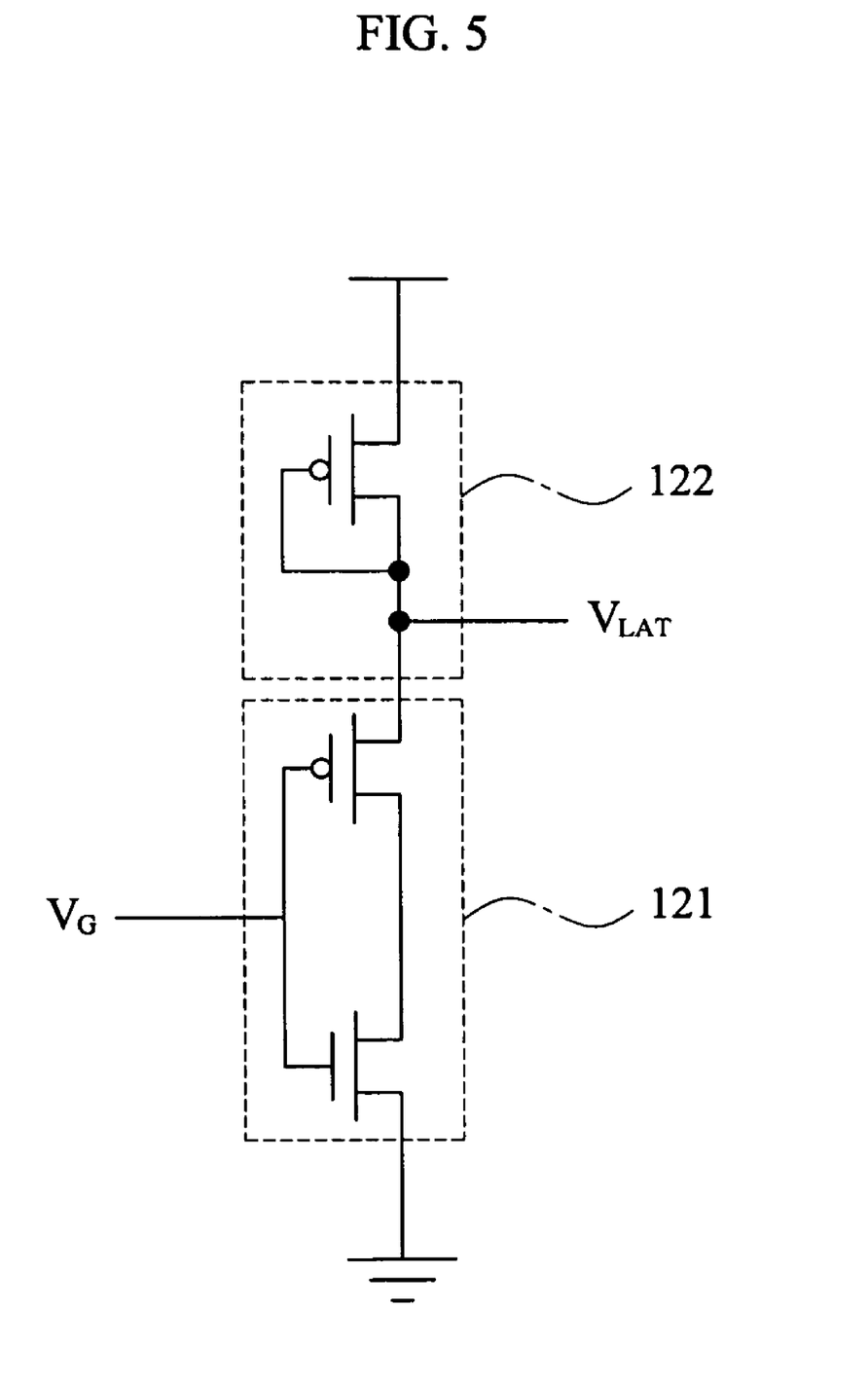
FIG. 5 illustrates an example circuit design of a sensing circuit and a converting circuit according to another example embodiment.
Figure 6:
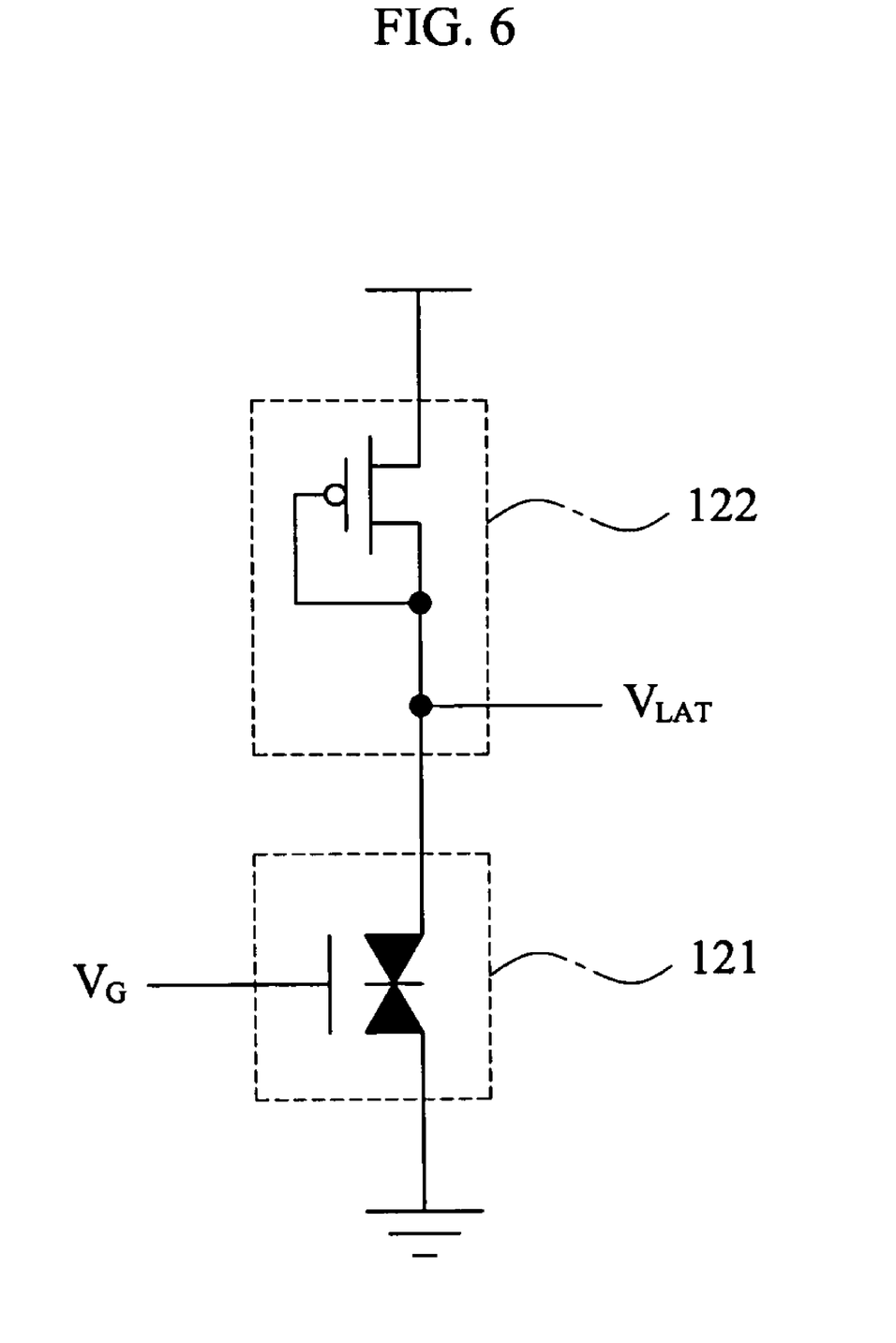
FIG. 6 illustrates an example circuit design of a sensing circuit and a converting circuit according to another example embodiment.

FIG. 5 illustrates a circuit design of another example embodiment of the sensing circuit 121 and the converting circuit 122 of FIG. 2. The circuit design shown in FIG. 5 may be operated using a single band read method. FIG. 6 illustrates another circuit design of an example embodiment of the sensing circuit 121 and the converting circuit 122 of FIG. 2. The circuit design shown in FIG. 6 may also be operated in accordance with a single band read method.

Referring to FIG. 5, the sensing circuit 121 and the converting circuit 122 of FIG. 2 may include a Complementary Metal Oxide Semiconductor (CMOS) of a P-channel Metal-Oxide Semiconductor (PMOS) load. When the sensing circuit 121 and the converting circuit 122 have such a configuration, the results shown in the graphs of FIGS. 4A through 4C may be obtained experimentally.

Referring to FIG. 6, the sensing circuit 121 and the converting circuit 122 of FIG. 2 may includes a Field-induced Interband Tunneling Effect Transistor of the PMOS load, the results shown in the graphs of FIGS. 4A through 4C may be obtained experimentally. Using the configurations shown in FIGS. 5 and 6, the apparatus 150 may read data from the memory cell 100 using a one-time read operation.

Figure 7A:
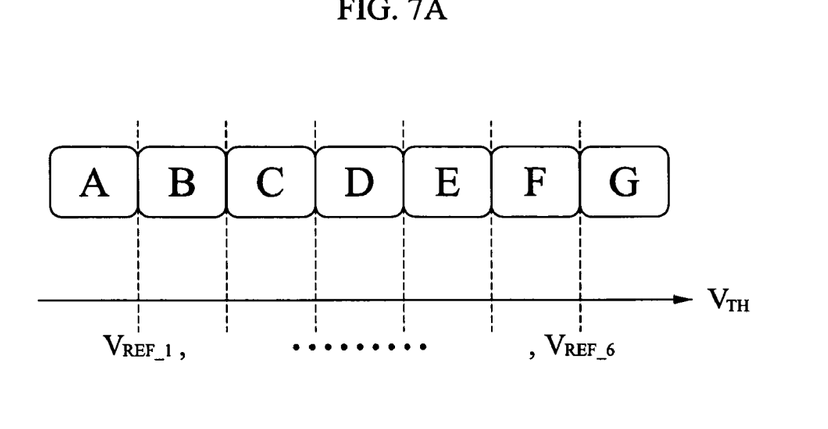
FIGS. 7A through 7C illustrate an input/output voltage relationship of FIG. 3 achievable using a multi-band read method.
Figure 7B:
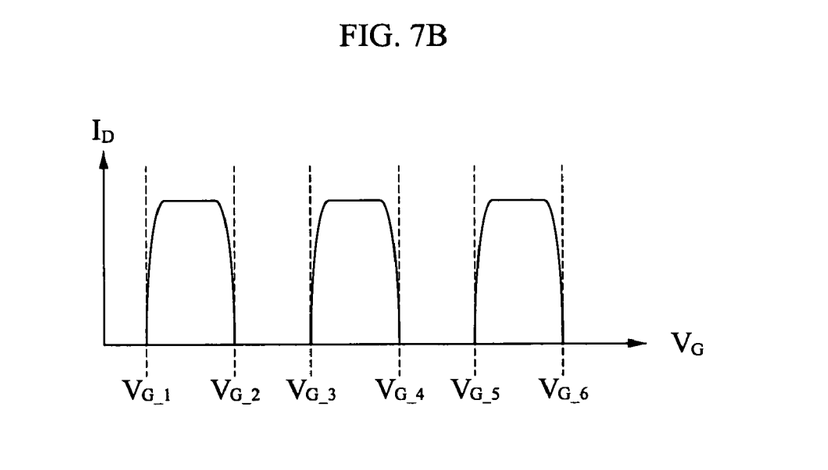
Figure 7C:
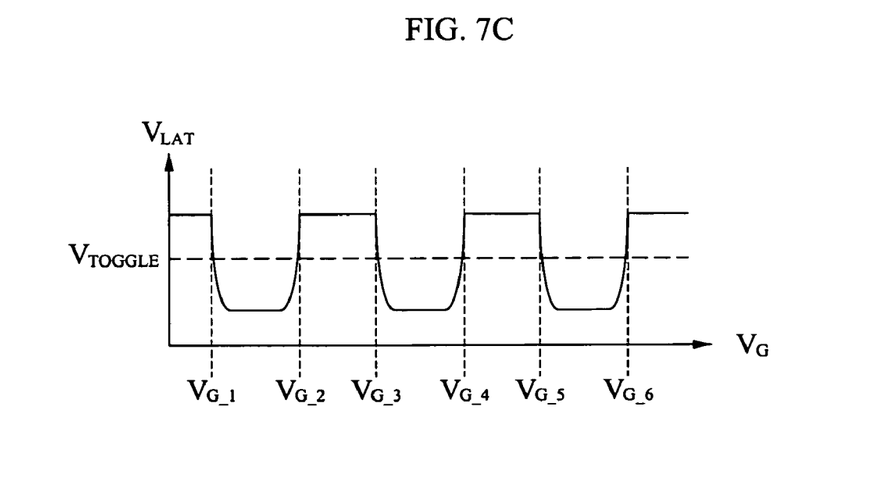

FIGS. 7A through 7C illustrate an input/output voltage relationship when operating the example circuit design of FIG. 3 in accordance with a multi-band read method.

Referring to FIG. 7A, in this example, when the sensing circuit 121 and the converting circuit 122 are designed as shown in FIG. 3, a mutual relationship between a voltage $V_G$ applied to the sensing circuit 121 and an output current $I_D$ as illustrated in FIG. 7B is achieved. When a current-to-voltage conversion device is used as the converting circuit 122, a mutual relationship between a voltage $V_G$ applied to the sensing circuit 121 and an output voltage $V_{LAT}$ as illustrated in FIG. 7C is achieved.

According to at least some example embodiments, a semiconductor device that senses a current within at least two specific voltage ranges may be used as the sensing circuit 121 to obtain the relationships shown in FIGS. 7A through 7C. In at least this example, the at least two specific voltage ranges may include respective specific upper limit voltage values and specific lower limit voltage values. In one example, a semiconductor device having negative differential transconductance may be used.

Figure 8:
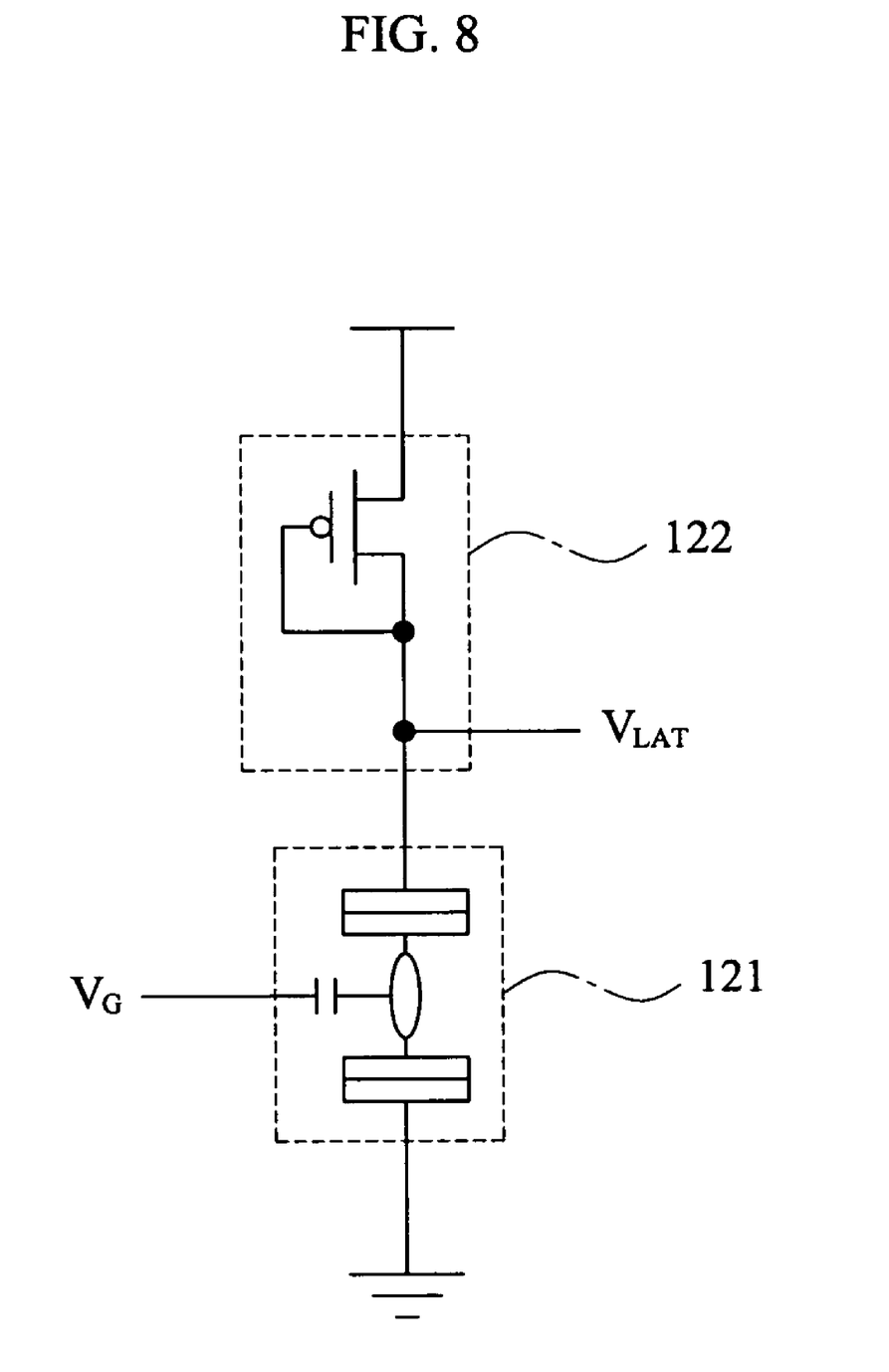
FIG. 8 illustrates a sensing circuit and a converting circuit according to another example embodiment.
Figure 9:
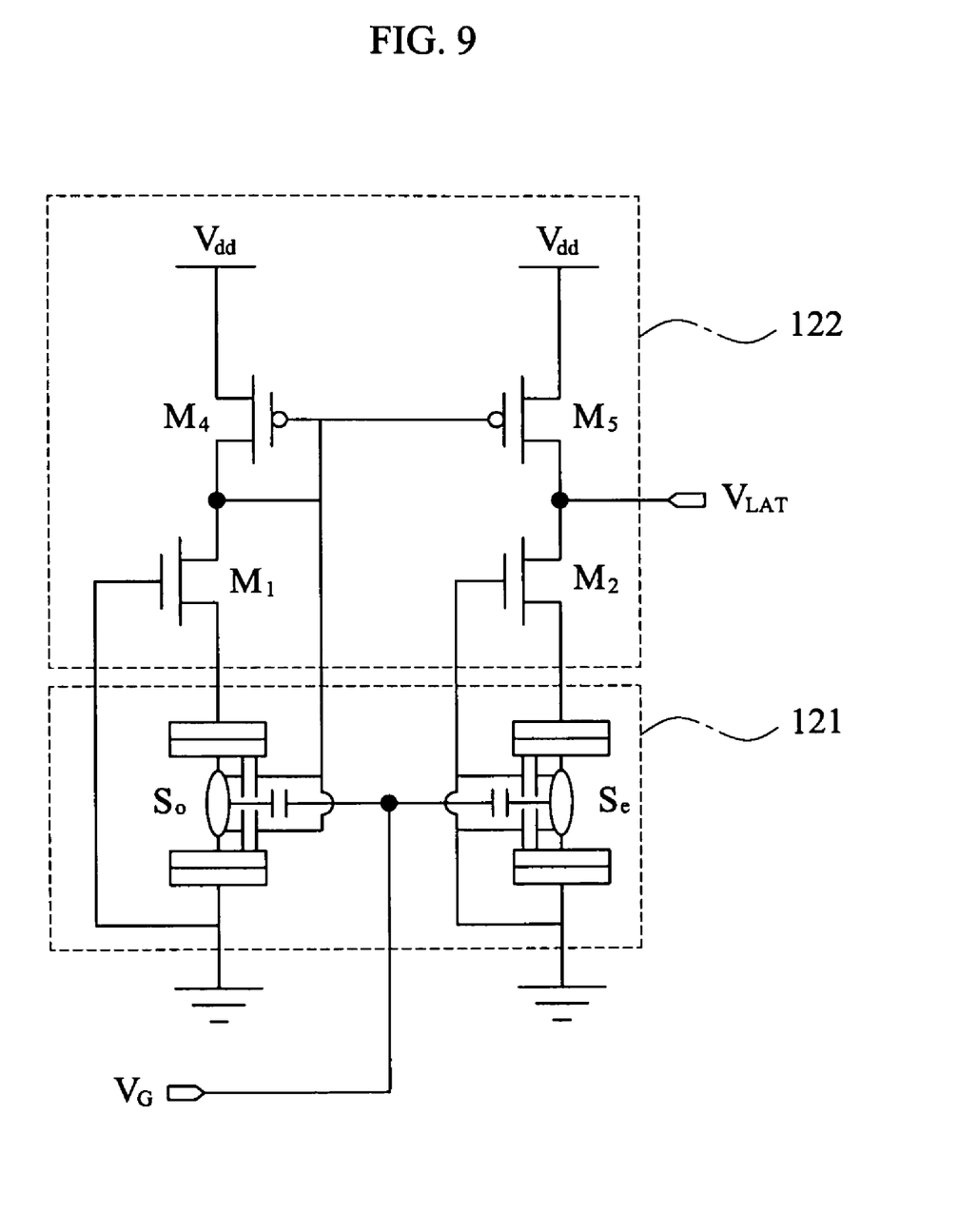
FIG. 9 illustrates a sensing circuit and a converting circuit according to another example embodiment.

FIG. 8 illustrates another example embodiment of the sensing circuit 121 and the converting circuit 122. The example embodiment shown in FIG. 8 may be operated in accordance with a multi-band read method. FIG. 9 illustrates another example embodiment of the sensing circuit 121 and the converting circuit 122, which may be also be operated in accordance with a multi-band read method.

Referring to FIG. 8, the sensing circuit 121 and the converting circuit 122 may include a Single Electron Transistor (SET) of a PMOS load. In this example, results shown in the graphs of FIGS. 7A through 7C may be obtained experimentally.

Referring to FIG. 9, the sensing circuit 121 and the converting circuit 122 may include a Periodic Multiple-Band Filter (PMBF). As shown in FIG. 9, each of M1 and M2 denotes a n-MOSFET, each of M4 and M5 denotes a p-MOSFET, $V_{DD}$ denotes a supply voltage, and each of So and Se denotes a single electron transistor. In this example, results shown in the graphs of FIGS. 7A through 7C may be obtained experimentally. Accordingly, if the sensing circuit 121 and the converting circuit 122 are designed in accordance with the configurations shown in FIG. 8 or 9, the apparatus 150 may read data from the memory cell 100 using a one-time read operation.

Figure 10:
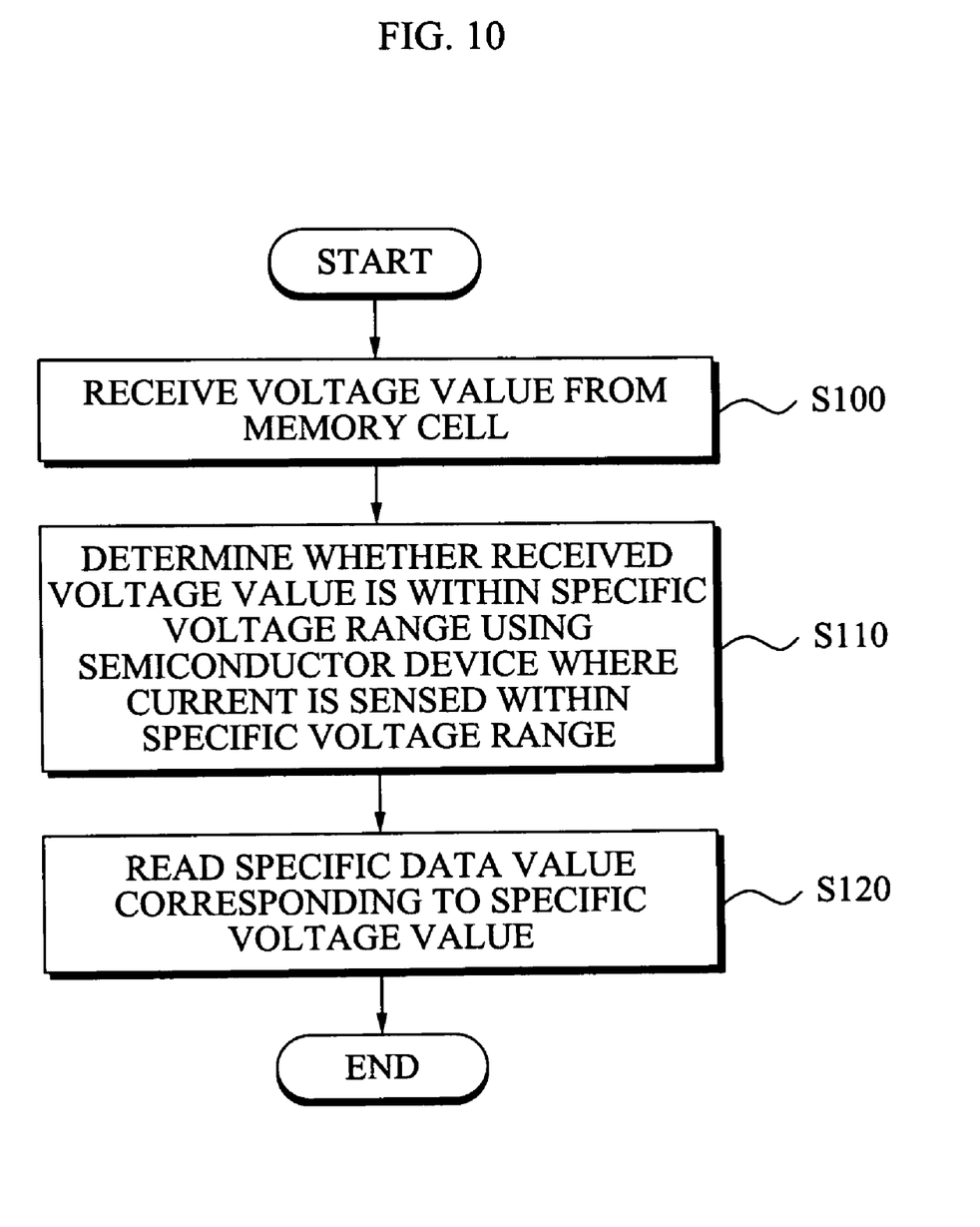
FIG. 10 is a flowchart illustrating a method of reading data of a memory cell according to an example embodiment.

FIG. 10 is a flowchart illustrating a method for reading data from a memory cell according to an example embodiment. Hereinafter, the method shown in FIG. 10 will be described with regard to FIG. 1 for the sake of clarity and brevity. The method of claim 10, however, may be performed using the apparatus 150 of FIG. 1 in combination with any of FIGS. 2-9.

Referring to FIG. 10, at S100, the apparatus 150 may receive a voltage value from a memory cell 100. In one example, the memory cell 100 may be a flash memory cell.

At S110, the apparatus 150 may determine whether the received voltage value is within a specific voltage range using a semiconductor device that senses a current within the specific voltage range. The semiconductor device may be a semiconductor device having negative differential transconductance, for example, a CMOS, FITET, SET, PMBF, or the like.

At S120, the apparatus 150 may read a data value (e.g., a pre-set specific data value) corresponding to the specific voltage range based on the determining result.

Figure 11:
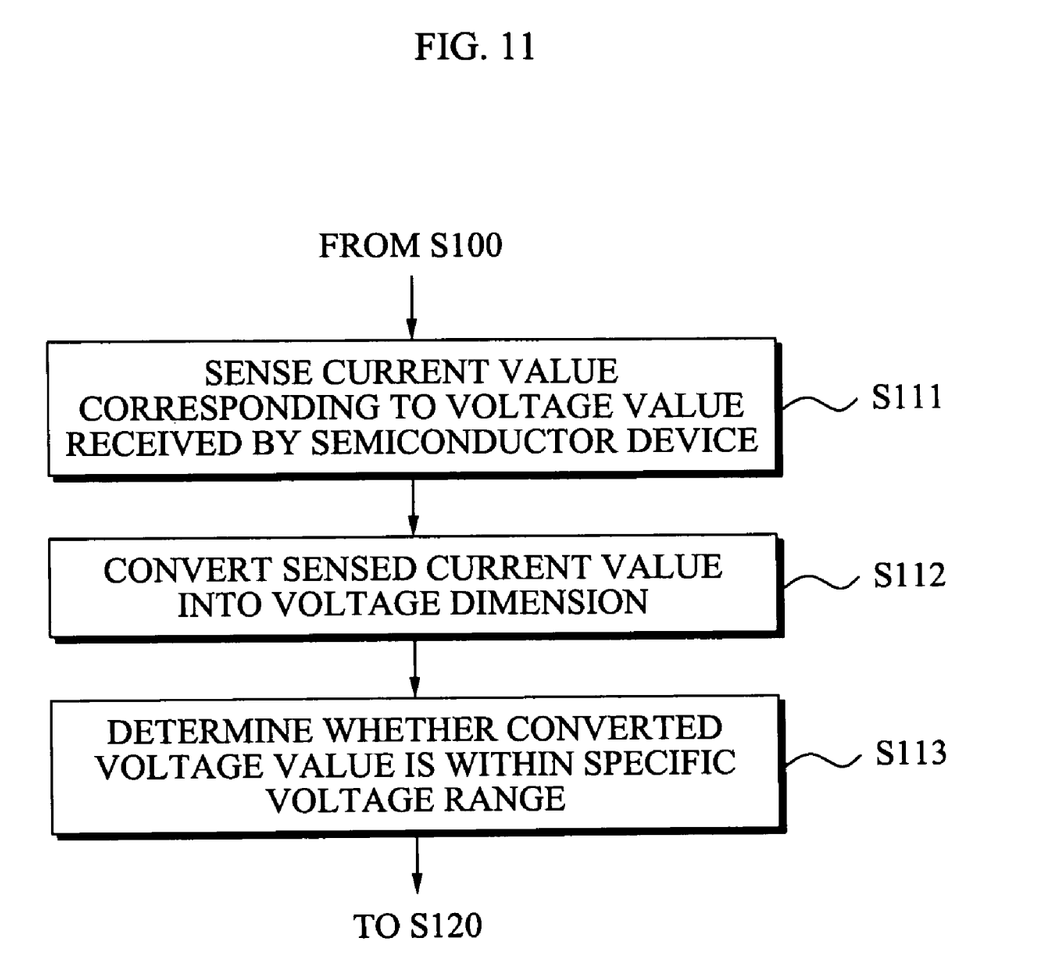
FIG. 11 is a flowchart illustrating a data read operation for a memory cell according to an example embodiment.

FIG. 11 is a flowchart illustrating an example embodiment of the operation of S110 in FIG. 10, in more detail.

Referring to FIG. 11, at S111, the determining circuit 120 may sense a current value $I_D$ corresponding to a voltage value $V_G$ applied to the determining circuit 120. As described above, the determining circuit 120 may include, for example, a CMOS, FITET, SET, PMBF, or the like. At S112, the determining circuit 120 may convert the sensed current value $I_D$ into a voltage dimension value $V_{LAT}$. At S113, the determining circuit 120 may determine whether the converted voltage value is within the specific voltage range.

Methods of reading data from memory cells according to example embodiments may be recorded on computer-readable media including computer-executable program instructions for causing a computer to perform the method steps/operations. The media may include, alone or in combination with the program instructions, data files, data structures, or the like. The media and program instructions may be those specially designed and constructed for the purposes of example embodiments described herein, or they may be of the kind well-known and available.

Examples of computer-readable media include magnetic media such as hard disks, floppy disks, and magnetic tape; optical media such as CD ROM disks and DVD; magneto-optical media such as optical disks; and hardware devices that are specially configured to store and perform program instructions, such as read-only memory (ROM), random access memory (RAM), flash memory, and the like.

Examples of program instructions include both machine code, such as produced by a compiler, and files containing higher level code that may be executed by the computer using an interpreter. The described hardware devices may be configured to act as one or more software modules to perform the operations of the above-described example embodiments.

Utilizing at least some example embodiments, the number of required read operations may be reduced when reading data from a memory cell, data processing speed of the memory cell may improve and/or costs required for a circuit design process may be reduced, thereby improving the efficiency of the resources used.

Although example embodiments have been shown and described, the present invention is not limited to the described example embodiments. Instead, it would be appreciated by those skilled in the art that changes may be made to these example embodiments without departing from the principles and spirit of the present invention, the scope of which is defined by the claims and their equivalents.

Example embodiments having thus been described, it will be obvious that the same may be varied in many ways. Such variations are not to be regarded as a departure from the intended spirit and scope of example embodiments, and all such modifications as would be obvious to one skilled in the art are intended to be included within the scope of the following claims.

What is claimed is:

1. A method for reading data from a memory cell, the method comprising:
    determining whether a voltage value received from the memory cell is within at least one first voltage range based on a sensed output current corresponding to the received voltage value, the determining being performed through a one-time read operation using a semiconductor device that senses the output current corresponding to the received voltage value, the at least one first voltage range including a first upper limit voltage value and a first lower limit voltage value; and
    setting a data value of the memory cell to a first data value corresponding to the at least one voltage range when the received voltage value is within the at least one first voltage range; wherein
    the semiconductor device has negative differential transconductance.

2. The method of claim 1, wherein the determining further includes,
    sensing an output current value corresponding to a received voltage value,
    converting the sensed output current value into a voltage dimension value, and
    determining whether the converted voltage value is within the at least one first voltage range.

3. The method of claim 1, wherein the memory cell is a flash memory cell.

4. The method of claim 1 wherein the semiconductor device having the negative differential transconductance includes at least one of a Complementary Metal Oxide Semiconductor (CMOS), a Field-induced Interband Tunneling Effect Transistor (FITET), a Single Electron Transistor, and a Periodic Multiple Band Filter (PMBF).

5. The method of claim 1, wherein the memory cell is operated in accordance with a Single Level Cell (SLC) method, and a number of first voltage ranges is one.

6. The method of claim 1, wherein the memory cell is operated in accordance with a Multi Level Cell (MLC) method.

7. A computer-readable recording medium storing a computer executable instructions that, when executed, cause a computer or a component thereof to perform a method of reading data from a memory cell, the method comprising:
    determining whether a voltage value received from the memory cell is within at least one first voltage range based on a sensed output current corresponding to the received voltage value, the determining being performed through a one-time read operation using a semiconductor device that senses the output current corresponding to the received voltage value, the at least one first voltage range including a first upper limit voltage value and a first lower limit voltage value; and
    setting a data value of the memory cell to a first data value corresponding to the at least one voltage range when the received voltage value is within the at least one first voltage range; wherein
    the semiconductor device has negative differential transconductance.

8. An apparatus for reading data from a memory cell, the apparatus comprising:
    a determining circuit configured to determine whether a voltage value received from the memory cell is within at least one first voltage range based on a sensed output current corresponding to the received voltage value, the determining circuit including a semiconductor device that senses the output current corresponding to the received voltage value, the at least one first voltage range including a first upper limit voltage value and a first lower limit voltage value; and
    a setting circuit configured to set a data value of the memory cell to a first data value corresponding to the at least one voltage range when the received voltage value is within the at least one first voltage range; wherein the determining circuit uses a one-time read operation to determine whether a voltage value received from the memory cell is within at least one first voltage range, and the semiconductor device has negative differential transconductance.

9. The apparatus of claim 8, further including, a receiving circuit configured to receive a voltage value from the memory cell and output the voltage value to the determining circuit.

10. The apparatus of claim 8, wherein the determining unit further includes, a sensing circuit configured to sense an output current value corresponding to a voltage value received by the semiconductor device, a converting circuit configured to convert the sensed output current value into a voltage dimension value, and a voltage range determining circuit configured to determine whether the converted voltage value is within the at least one first voltage range.

11. The apparatus of claim 8, wherein the memory cell is a flash memory cell.

12. The apparatus of claim 8 wherein the semiconductor device having the negative differential transconductance includes at least one of a Complementary Metal Oxide Semiconductor (CMOS), a Field-induced Interband Tunneling Effect Transistor (FITET), a Single Electron Transistor, and a Periodic Multiple Band Filter (PMBF).

13. The apparatus of claim 8, wherein when the memory cell is operated according to a Single Level Cell (SLC) method.

14. The apparatus of claim 8 wherein when the memory cell is operated according to a Multi Level Cell (MLC) method.

* * * * *